United States Patent [19]

Biter

[11] 4,320,154

[45] Mar. 16, 1982

[54] METHOD OF FORMING SOLAR CELLS BY GRID CONTACT ISOLATION

[75] Inventor: William J. Biter, Murrysville, Pa.

[73] Assignee: Westinghouse Electric Corp., Pittsburgh, Pa.

[21] Appl. No.: 171,930

[22] Filed: Jul. 18, 1980

[51] Int. Cl.³ .................... H01L 35/34; H01L 31/04
[52] U.S. Cl. ........................................ 427/75; 427/74
[58] Field of Search .................................. 427/74, 75

[56] References Cited

U.S. PATENT DOCUMENTS 3,480,473 11/1969 Tanos ................................. 136/258
3,975,211 8/1976 Shirland ............................. 136/258
4,167,805 9/1979 Castel ................................ 136/260

Primary Examiner—James R. Hoffman
Attorney, Agent, or Firm—D. P. Cillo

[57] ABSTRACT

A solar cell structure is produced by a method comprising baking the solar cell, containing a gridded top layer of cuprous sulfide formed on a base of cadmium sulfide, for 20 minutes to 10 hours, to produce a copper doped CdS electrically insulating region in the cadmium sulfide base near the interface of the cuprous sulfide and the cadmium sulfide; removing the cuprous sulfide, and the copper doped CdS insulating region not covered by the grid, to provide a bare cadmium sulfide areas; and then forming a cuprous sulfide layer on the exposed areas not covered by the grid.

8 Claims, 5 Drawing Figures

METHOD OF FORMING SOLAR CELLS BY GRID CONTACT ISOLATION

BACKGROUND OF THE INVENTION

Solar cells operate on the principle of conversion of light to electrical energy. Cadmium sulfide solar cells comprise a base of cadmium sulfide usually deposited on a suitable metal or metal coated substrate. A barrier layer is formed on the cadmium sulfide, and a metallic grid is then applied on top of the barrier layer. The barrier layer in a cadmium sulfide cell is usually a cuprous sulfide material. The barrier layer can act as a P-type semiconductor. It is integrally mated to cadmium sulfide, which can act as an N-type semiconductor material. The incidence of light on this combination of materials produces power. By connecting appropriate lead wires to the grid on the cuprous sulfide barrier layer, and to the metal substrate in contact with the cadmium sulfide, a circuit can be formed for the flow of electrical power. Such cells are well known in the art, and are described in U.S. Pat. Nos. 3,480,473; 3,975,211; and 4,167,805.

A wide variety of problems have been associated with production of the CdS-Cu$_2$S solar cell. It is thought, that when the crystals of cadmium sulfide are formed, they tend to drive to the top surface small amounts of impurities which cannot be accommodated by the lattice structure of the crystals. If a barrier layer is then found in proximity to the impurities, detrimental effects may result. Tanos, in U.S. Pat. No. 3,480,473, solved this problem with a H$_2$SO$_4$ or HCl etch of the cadmium sulfide, to remove the impurities prior to formation of the barrier layer. This etch also improved light collection properties of the cadmium sulfide film.

Castel, in U.S. Pat. No. 4,167,805, recognized problems of copper migration in copper gridded CdS-Cu$_2$S cells. After the Cu$_2$S is formed on the base CdS, it is necessary to "heat treat" the cell, for a maximum of 10 minutes at up to 260° C., to complete the formation of the CdS-Cu$_2$S heterojunction. Metallic copper, from a copper electrode grid attached prior to "heat treatment", and from the Cu$_2$S layer, readily diffuses into the cell. This lowers the copper content of the Cu$_2$S barrier and produces undesirable degration in cell performance. The higher the "heat treatment" temperature and the longer the duration of "heat treatment", the more degradation. Castel solved this problem, in part, by forming a Cu$_{2.00}$S layer and then a Cu$_{2.00-x}$S layer, where x may be from about 0.05 to 0.20. Upon "heat treatment", diffusion of copper causes the copper deficient lattice of the Cu$_{2.00-x}$S to fill and form the desired high efficiency Cu$_{2.00}$S material. This dual cuprous sulfide formation is a very complicated process, however.

What is needed is a simple and inexpensive method of using and isolating metallic mesh grids in CdS-Cu$_2$S solar cells. The method should be mechanically straightforward and repeatable, so that equipment costs, manpower costs and rejection rates are minimized.

SUMMARY OF THE METHOD

Generally, the above problems are solved, and the above needs are met, by forming a high electrical resistance, copper doped CdS region, which actually degrades the output of the cell; removing the cuprous sulfide and the copper doped CdS region; and then applying a new Cu$_2$S layer over the bare CdS areas.

The method comprises: (1) providing a high output thin film solar cell, comprising a top layer of cuprous sulfide formed on a base of cadmium sulfide, and having an applied metallic grid on the surface of the cuprous sulfide, all being supported by a suitable metal or metal coated bottom substrate having means of electrical conductivity, (2) baking the cell with its applied grid, for between 20 minutes and 10 hours, at between 200° C. and 300° C., to effect a copper doped CdS, herein defined as CdS:Cu, a highly electrically insulating, high resistance region within the cadmium sulfide base, near the interface between the cuprous sulfide and the cadmium sulfide, (3) removing the cuprous sulfide, the copper doped CdS insulating region, and usually, a portion of the cadmium sulfide not covered by the metallic grid, to provide bare cadmium sulfide areas not covered by the grid, and (4) forming a cuprous sulfide layer on the exposed areas of CdS:Cu and cadmium sulfide not covered by the metallic grid.

Preferably, in step (1) above, the cadmium sulfide will be textured and roughened by acid before cuprous sulfide formation, followed by a "heat treatment" of up to 10 minutes after cuprous sulfide formation and prior to grid application. As a final step, a short "heat treatment" of up to 10 minutes may be used to optimize cell output.

Advantages of this method include the use of copper or other metal grids without the use of complicated dual cuprous sulfide formation steps, and complete electrical isolation of the grid, substantially eliminating any chance of a short circuit. The cuprous sulfide, copper doped CdS, and CdS removal steps, as well as the Cu$_2$S reformation step are very quick and inexpensive. Thus, no significant cost increase in the fabrication of the solar cell would be expected from the above described grid contact isolation method.

BRIEF DESCRIPTION OF THE DRAWINGS

For a better understanding of the invention, reference may be made to the preferred embodiments, exemplary of the invention, shown in the accompanying drawings, in which.

DESCRIPTION OF THE PREFERRED EMBODIMENTS

Figure 1:
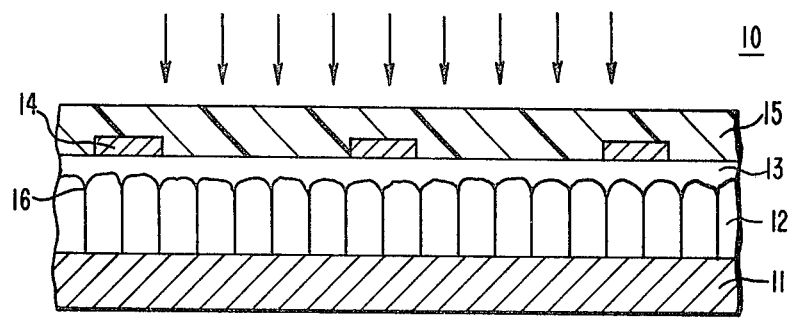
FIG. 1 is a cross-sectional view of a complete cadmium sulfide-cuprous sulfide thin film solar cell.

Referring now to FIG. 1 of the drawings, a photovoltaic solar cell 10 is shown, comprising a metallic or metal coated substrate 11, a cadmium sulfide base film 12, a top cuprous sulfide barrier 13, metallic grids 14 applied to the surface of the barrier layer, and a transparent protective coating 15. The cadmium sulfide, CdS, polycrystalline films used for thin film solar cells are typically 20 to 30 microns thick, with individual grains approximately 1 micron in width and extending the full thickness of the film. The CdS forms in the hexagonal or "Wurtzite" crystal structure and has a preferred orientation with the "C" axes of the individual grains generally oriented perpendicular to the substrate, but with the three "A" axes randomly oriented in directions generally parallel to the plane of the substrate. These CdS films are usually produced by evaporating CdS in a vacuum onto a conductive substrate 11 such as a smooth polished metal sheet, as shown in FIG. 1. Other methods of CdS deposition, including sintering, sputtering or spraying may also be used. Suitable substrates would include zinc coated copper, molybdenum, steel, zinc coated glass, tin oxide coated glass and the like, as are well known in the art.

When the crystals of CdS are formed they may tend to drive to the outer surface certain amounts of impurities which cannot be accommodated by the lattice structure of the crystals. Relatively minute quantities of impurities if they were to concentrate in a subsequently formed barrier layer could change the properties of the barrier layer. Because of this, and also to improve solar light collection properties, the CdS film is preferably textured and roughened by a 2 second to 15 second dip in a 1:0.5 to 1:10 volume ratio of a hydrochloric acid:water solution, held at between about 40° C. to 70° C. This dip removes the top 1 to 3 microns of the CdS film. Such texturing may also be accomplished with a sulfuric acid solution dip.

The substrate, with the attached polycrystalline CdS film, is then contacted, usually by dipping, with a solution containing cuprous ions for between 2 seconds to 20 seconds. The preferred solution is a saturated solution of CuCl held at about 80° C. to about 100° C. The $Cu^+$ ions displace cadmium ions through an ion exchange mechanism, to form a cuprous sulfide, $Cu_2S$, layer 13 at the CdS surface. The sulfur atoms of $Cu_2S$ layer 13 so formed maintain the same geometrical spacing that they had in the original CdS crystallites. The $Cu_2S$ layer 13 is on the order of a few hundred to twenty thousand Angstrom Units (up to about 2.0 micron) thick, thus yielding what amounts to an epitaxial structure of $Cu_2S$ on CdS.

The $Cu_2S$ layer 13 is thin enough so that the stresses from lattice spacing mis-match do not build up sufficiently to cause the $Cu_2S$ to fracture mechanically. The $Cu_2S$ material also forms in the boundaries 16 of the CdS grains, as illustrated in FIG. 1, penetrating to a depth, in some instances, of about 10 microns, that is, to ⅓ of the total film thickness for a 30 micron thick film. The actual stoichiometry of the $Cu_xS$ layer formed from the cuprous solution may not always equal the theoretical value $x=2$. Oxidation of cuprous ions in solution and of the resulting cuprous sulfide layer may result in x being between about 1.8 and 2.0. The $Cu_{2.00}S$ form is much preferred, since loss of copper to the $Cu_{1.95}S$ form will reduce efficiency about 20% to 40%. The term cuprous sulfide is here defined as including all such phases.

After formation of the cuprous sulfide layer on the base CdS film, the cell may be "heat treated" in air, at about 200° C. to about 260° C. After about 1 minute to about 10 minutes, usually after 2 minutes at 250° C., there is complete formation of the heterojunction between cuprous sulfide and CdS at their interface. After formation of the heterojunction, a solar cell is provided having a top layer of cuprous sulfide which can act as a P-type semiconductor, on top of a CdS base which can act as an N-type semiconductor, providing a P-N junction interface. A metallic grid can be attached to the surface of the cuprous sulfide before or after formation of the heterojunction. The grid material is selected from silver, gold lead, tin, aluminum and preferably copper, among others. It may be applied by any suitable means, such as sputtering, electroplating and vacuum evaporation, through an aperture mask. Such application has been found to provide a possible low resistance short circuit region below the grid, however.

The next and critically essential step is to deliberately degrade the cell output by a drastic baking step, which is about five to ten times as long as that generally used to form the heterojunction. This long baking will severely degrade the output of the cell by dropping the light generated current, and also by introducing a high series resistance into the output characteristics of the cell. This has the effect of producing a high compensated region comprising a high resistance copper doped CdS, CdS:Cu, electrically insulating region within the cadmium sulfide base, near the interface junction of the cuprous sulfide and the cadmium sulfide. The baking in this step will be applied for between 20 minutes and 10 hours, at between 200° C. and 300° C., in any suitable forced air or other type oven.

This baking is very substantially beyond that required to complete formation of the $CdS-Cu_2S$ heterojunction and serves to electrically isolate the grid from the cadmium sulfide base film. This baking step goes beyond the short "heat treatment" heretofore described to complete formation of the heterojunction between the cuprous sulfide and the cadmium sulfide. The cell may be "heat treated" for 2 minutes at 250° C., the grid applied, and finally the gridded cell baked for 20 minutes at 250° C.; or the grid may be applied and the cell baked for 20 minutes at 250° C. to effect formation of the heterojunction and also the compensated region.

Figure 2:
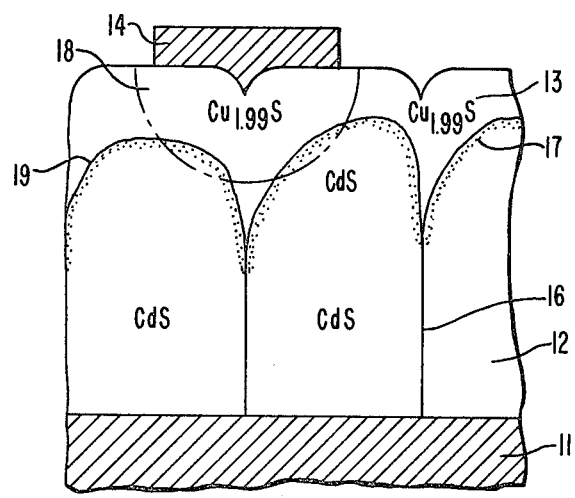
FIG. 2 is an enlarged cross-sectional view of a thin film solar cell after "heat treatment" and grid attachment.

Referring now to the enlarged views shown in FIG. 2 and the subsequent figures, the grid is shown as 14, applied to the surface of the cuprous sulfide layer 13. This cuprous sulfide layer conforms to the grain structure of the CdS base 12, which has grain boundaries 16. The layer 13 is shown much thicker than in reality for the sake of simplicity. It is usually about 0.2 micron compared to the CdS layer which is usually about 20 microns thick. The substrate is shown as 11. Upon "heat treatment" to form the heterojunction, minute quantities of copper diffuse into the region 17 in the CdS just below the heterojunction, causing some copper loss from the cuprous sulfide, which now has the approximate chemical formula of $Cu_{1.99}S$. In addition, after the grid 11 is applied by electroplating, sputtering or vacuum deposition, a low resistance region 18, shown as within the semi circle dot dash line in the drawings, is formed, by a little understood mechanism, below the grid. This low resistance region provides the possibility for a short circuit of the cell. The resistance in region 18 is about 50 to 100 times less than the resistance at the heterojunction 19, and lowers the open circuit voltage beneath the grid. Other portions of the cell not under the grid do not have this problem, as shown in FIG. 2.

Figure 3:
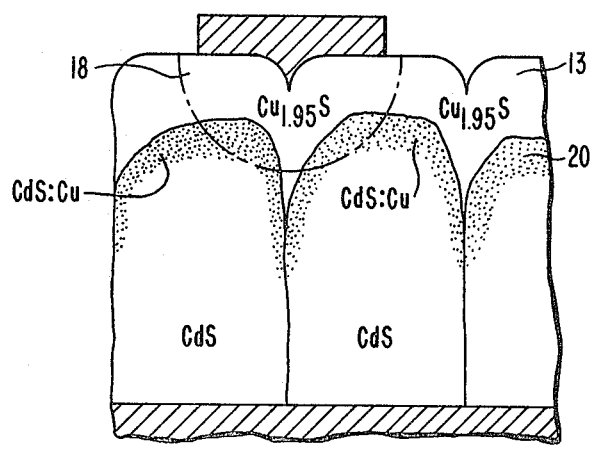
FIG. 3 is an enlarged cross-sectional view of a gridded cadmium sulfide-cuprous sulfide thin film solar cell after baking.

In the method of this invention, the gridded cell is then baked, and the results are shown in FIG. 3. As can be seen, the extensive heating, for between 20 minutes and 10 hours, produces an actual copper doping of the CdS layer, to form what is herein defined as a CdS:Cu region. This CdS:Cu region 20 provides a high resistance, highly electrically insulating region in the base CdS near the interface of the cuprous sulfide and the CdS. This CdS:Cu region essentially surrounds and contains the low resistance region 18. In the CdS:Cu region, copper is present in the amount of about 0.001 to about 1.0 atomic percent of the cadmium in the CdS, i.e., $Cd_{1-x}S:Cu_x$ where $x = 0.00001$ to 0.01. This CdS:Cu region seriously degrades the solar cell output, and such heating has heretofore been carefully guarded against. In addition, the cuprous sulfide layer 13 loses additional copper, now having the approximate chemical formula of $Cu_{1.95}S$, a form which reduces cell efficiency about 40 percent compared to the $Cu_{2.0}S$ form. Thus the baking step is a deliberate solar cell power reducing operation. However, subsequent steps are taken to turn this to an advantage.

Figure 4:
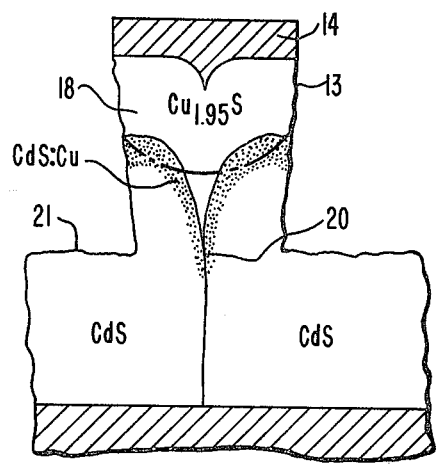
FIG. 4 is an enlarged cross-sectional view of a cadmium sulfide-cuprous sulfide thin film solar cell after removing the cuprous sulfide, the copper doped CdS insulating region, and a portion of the CdS.

As shown in FIG. 4, the cuprous sulfide 13 not protected by the grid 14 is removed, as is the CdS:Cu region. Usually, though it is not necessary, a small part of the CdS base is also removed. The cuprous sulfide 13 under the grid 14, as well as the low resistance region 18, and the CdS:Cu region 20 under the grid remain, to support the grid. The most practical way to remove the cuprous sulfide is by etching, usually by dipping, for an effective time, about 1 to 45 seconds, in a solution containing about 0.05 to 0.35 mole of KCN/liter of water. This will selectively remove the cuprous sulfide but not the doped or undoped CdS. The CdS:Cu region and a portion of the CdS are then best removed by etching, usually by dipping, for an effective time, about 2 to 15 seconds, preferably 5 to 10 seconds, in a 1:0.5 to 1:10 volume ratio of a hydrochloric acid:water solution. This will remove about 0.5 to 1.5 microns of the combined CdS:Cu and CdS, to provide bare CdS areas 21. Such etching may also be accomplished with a sulfuric acid solution dip.

Figure 5:
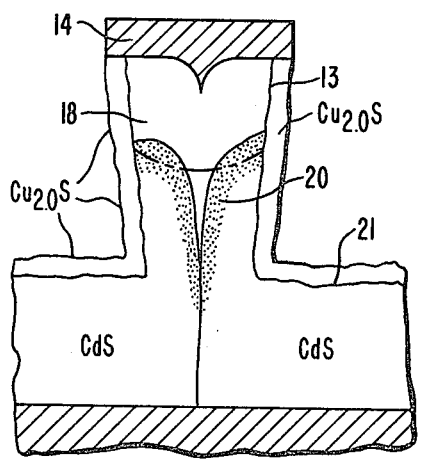
FIG. 5 is an enlarged cross-sectional view of a gridded cadmium sulfide-cuprous sulfide thin film solar cell after reforming Cu$_2$S, showing the electrically isolated grid.

A cuprous sulfide layer is then formed on the exposed areas of CdS:Cu and CdS by means of applying a solution containing cuprous ions for between 2 seconds to 20 seconds. The preferred solution is a saturated solution of CuCl held at about 80° C. to about 100° C. This is most readily accomplished by a dipping operation. As can be seen in FIG. 5, a reformed layer of $Cu_{2.0}S$ forms on the bare CdS areas 21, on the exposed CdS:Cu region 20 and also on the copper deficient cuprous sulfide layer 13 beneath the grid 14, i.e., on all areas not covered by the metallic grid. As can be seen, this now provides an efficient $Cu_{2.0}S$ path from the grid to the CdS bypassing the CdS:Cu region. As a final step, an additional 1 minute to 10 minute "heat treatment" at about 200° C. to about 260° C., preferably 2 minutes at 250° C., can be used to optimize the final output of the solar cell. Electrical leads can then be applied to the grid and substrate and a protective coating can be applied over the re-formed $Cu_2S$ layer. While this invention is described as a "solar cell", it is to be understood that the invention encompasses all forms of light that can be used to generate current in the cell.

EXAMPLE

A gridded thin film solar cell was formed by vacuum evaporating a 30 micron CdS base on a 1 cm. × 1 cm. × 1 mil (0.001 inch) thick zinc coated copper substrate. The zinc coating was about 0.5 micron thick. This CdS supported composite was textured by a 5 second dip in a 1:1 volume ratio solution of $HCl:H_2O$, under a hood, to remove from 1 to 2 microns of CdS and provide a rough, sharpened surface free of impurities and having good light trapping properties. The textured composite was then dipped in a saturation solution of CuCl, held at 100° C., for 5 seconds. This converted the top 0.2 micron of CdS to P-type $Cu_{2.0}S$ by an ion exchange mechanism. The $CdS-Cu_2S$ composite was then placed in a forced air oven and held at 250° C. for 2 minutes to "heat treat" the $Cu_2S$ and CdS and completely form the interface heterojunction, a small spot contact was placed on the cuprous sulfide and the open circuit voltage was then measured.

Next, a 1 micron thick 1 mil. wide, fine line copper grid pattern, having 50 conductors/inch, was vacuum evaporated onto the $Cu_2S$ surface through an aperture mask. At this point leads were placed on the grid and the substrate and short circuit current and the open circuit voltage were measured. The gridded thin film solar cell, having a P-N junction at the cuprous sulfide-cadmium sulfide interface, was then placed in a forced air oven and baked at 250° C. for 30 minutes. This long heating severely degraded the output of the cell, but served also to electrically isolate the grid from the CdS base by forming a doped CdS:Cu region on the CdS near the dual film heterojunction.

The thin film cell was then dipped in a KCN etching solution, containing 0.1 mol. KCN/liter of $H_2O$ for about 5 seconds, under a hood. This effectively removed the cuprous sulfide layer down to the heterojunction. The grid protected the cuprous sulfide immediately below it. The CdS:Cu region and some additional CdS was then removed by dipping the thin film cell in a 1:1 volume ratio of a $HCl:H_2O$ solution for 5 seconds, under a hood. This etched away about 1 micron of combined CdS:Cu and CdS, leaving bare CdS and the copper grid structure supported by directly underlying cupric sulfide, CdS:Cu and CdS, as shown in FIG. 4 of the drawings. Neither etchant attacked the metal grid so that the electrical isolation produced by the extended baking continued to prevent shorting between the grid and the substrate. The structure was then dipped in saturation solution of CuCl, held at 100° C., for 5 seconds. This re-formed a $Cu_{2.0}S$ layer from the exposed areas of CdS:Cu, CdS and the copper depleted cuprous sulfide, as shown in FIG. 5 of the drawing. An additional 2 minute 250° C. "heat treatment" in a forced air oven provided the optimized gridded thin film solar cell. Again current and voltage measurements were taken and the results are shown below in Table 1:

TABLE 1

| Step | Open Circuit Voltage | Short Circuit Voltage |
|---|---|---|
| At heterojunction formation, before grid application | 0.5 volts | — |
| After grid application and heat treatment, before baking | 0.15 volts | 20 ma/sq cm |
| After baking for 30 min. | — | 3.5 ma/sq cm |
| After re-forming $Cu_2S$ | 0.5 volts | 20 ma/sq cm |

Voltage measurements were taken with a voltmeter and current measurements were taken with an ampmeter, with the cell exposed to a tungsten quartz iodide lamp generating 95 milliwatts/sq. cm. power.

As can be seen from the data, after grid application and heat treatment, and before baking, the open circuit voltage dropped dangerously low, providing a good possibility of a short circuit due to the not completely understood low resistance area formed directly under the grid. Baking kills the short circuit current but serves to isolate the grid and low resistance region with a CdS:Cu high resistance region. After etching away cuprous sulfide, CdS:Cu and CdS areas between the grid metal to bare CdS, and then re-forming a $Cu_{2.0}S$ layer, both the open circuit voltage and short circuit current are completely restored to maximum values. As can be seen in the table, after $Cu_2S$ re-forming, these values increased by a factor of over 3, to a level equal to original values. The same outstanding results would occur if the grid were to be applied first and the gridded composite were then to be baked to form the CdS:Cu region.

I claim:

1. A method of making a gridded, high output solar cell structure, comprising the steps:
   (1) providing a thin film cell, comprising a top layer of cuprous sulfide formed on a base of cadmium sulfide, and having an applied metallic grid on the surface of the cuprous sulfide,
   (2) baking the gridded cell for between 20 minutes and 10 hours at between 200° C. and 300° C., to form a CdS:Cu electrically insulating, high resistance region within the cadmium sulfide base,
   (3) removing the cuprous sulfide layer not covered by the metallic grid,
   (4) removing the CdS:Cu region not covered by the metallic grid, to provide bare cadmium sulfide areas, and
   (5) forming a layer of cuprous sulfide on all areas not covered by the metallic grid.

2. The method of claim 1, where, in step (2), the metallic grid is electrically isolated from the cadmium sulfide by the CdS:Cu region, said CdS:Cu region being located near the interface between the cuprous sulfide and the cadmium sulfide and having the chemical formula $Cd_{1-x}S:Cu_x$, where x has a value between 0.00001 and 0.01.

3. The method of claim 1, wherein the cell provided in step (1) has a low resistance region below the grid, said region being formed during grid application, said region being electrically isolated from the cadmium sulfide by the CdS:Cu region formed in step (2).

4. The method of claim 1, where the cell provided in step (1) has a low open circuit voltage caused during grid application, and where baking in step (2) lowers the short circuit current of the cell, and wherein, after step (5) both the open circuit voltage and the short circuit current are increased by a factor of at least about 3.

5. The method of claim 1, where the cadmium sulfide base in the cell provided in step (1) had a textured, roughened top layer prior to cuprous sulfide formation thereon.

6. The method of claim 1, where the cell provided in step (1) has a heterojunction at the interface between the cuprous sulfide and the cadmium sulfide, said cuprous sulfide being effective to act as a P-type semiconductor, and said cadmium sulfide being effective to act as an N-type semiconductor.

7. The method of claim 6, where the substrate comprises zinc coated copper, the cuprous sulfide is removed in step (3) by etching in a solution of KCN, the CdS:Cu is removed in step (4) by etching in a solution of HCl, and where both the copper grid and the substrate have electrical leads applied thereto.

8. The method of claim 1, where, after step (4) the cell is heated for between 1 minute and 10 minutes at between 200° C. and 260° C.

* * * * *